(12) United States Patent
Huber et al.

(10) Patent No.: US 12,142,661 B2
(45) Date of Patent: Nov. 12, 2024

(54) AUTOMATIC REVERSE BLOCKING BIDIRECTIONAL SWITCH

(71) Applicant: Infineon Technologies Austria AG, Villach (AT)

(72) Inventors: Jonas Emanuel Huber, Aarau (CH); Johann Kolar, Zurich (CH); Kenneth Kin Leong, Villach (AT)

(73) Assignee: Infineon Technologies Austria AG, Villach (AT)

( * ) Notice: Subject to any disclaimer, the term of this patent is extended or adjusted under 35 U.S.C. 154(b) by 215 days.

(21) Appl. No.: 17/542,660

(22) Filed: Dec. 6, 2021

(65) Prior Publication Data
US 2023/0178626 A1   Jun. 8, 2023

(51) Int. Cl.
*H01L 29/66* (2006.01)
*H01L 29/10* (2006.01)

(52) U.S. Cl.
CPC ........ *H01L 29/66068* (2013.01); *H01L 29/10* (2013.01); *H01L 29/66348* (2013.01)

(58) Field of Classification Search
CPC ............... H01L 29/66068; H01L 29/10; H01L 29/66348; H01L 21/8252; H01L 27/0605; H01L 29/2003; H01L 29/42356; H01L 29/7786; H01L 27/0629; H01L 29/7833–7836; H01L 29/778–7789;
(Continued)

(56) References Cited

U.S. PATENT DOCUMENTS

| 7,164,589 B1 | 1/2007 | Soldano et al. |
| 7,595,680 B2 | 9/2009 | Morita et al. |

(Continued)

FOREIGN PATENT DOCUMENTS

| CN | 102640288 A | 8/2012 |
| CN | 105871365 A | 8/2016 |

(Continued)

OTHER PUBLICATIONS

"Industry's first 1200V Half Bridge Module based on GaN technology", VisIC Techologies, https://www.psma.com/sites/default/files/uploads/tech-forums-semiconductor/presentations/is012-industrys-first-1200v-half-bridge-module-based-gan-technology.pdf, Nov. 2022, pp. 1-45.

(Continued)

*Primary Examiner* — Shahed Ahmed
(74) *Attorney, Agent, or Firm* — Murphy, Bilak & Homiller, PLLC

(57) ABSTRACT

A monolithically integrated bidirectional switch includes: an output terminal; a control terminal; a compound semiconductor substrate; a common drift region in the compound semiconductor substrate and in series between the input terminal and the output terminal; a first gate; and a second gate. The first gate is electrically connected to the control terminal and the second gate is electrically connected to the input terminal, or one of the first gate and the second gate is a normally-on gate and the other one of the first gate and the second gate is a normally-off gate. In either case, the monolithically integrated bidirectional switch is configured to conduct current in a single direction from the input terminal to the output terminal through the common drift region. A corresponding power electronic system that uses the monolithically integrated bidirectional switch is also described.

11 Claims, 13 Drawing Sheets

(58) Field of Classification Search
CPC ..... H01L 29/122–127; H01L 29/66431; H01L 29/66462; Y02B 70/10; H03K 17/06; H03K 17/72; H03K 2217/0054; H02M 1/08

See application file for complete search history.

(56) References Cited

U.S. PATENT DOCUMENTS

| | | |
|---|---|---|
| 7,768,758 B2 | 8/2010 | Maier et al. |
| 7,825,467 B2 | 11/2010 | Willmeroth et al. |
| 7,852,137 B2 | 12/2010 | Machida et al. |
| 7,868,353 B2 | 1/2011 | Machida et al. |
| 7,875,907 B2 | 1/2011 | Honea et al. |
| 8,344,424 B2 | 1/2013 | Suh et al. |
| 8,487,667 B2 | 7/2013 | Iwamura |
| 8,604,512 B2 | 12/2013 | Morita |
| 8,649,198 B2 | 2/2014 | Kuzumaki et al. |
| 8,664,690 B1 | 3/2014 | Chen et al. |
| 9,276,569 B2 | 3/2016 | Ikeda |
| 9,443,845 B1 | 9/2016 | Stafanov et al. |
| 10,224,924 B1 | 3/2019 | Leong |
| 10,411,698 B2 | 9/2019 | Sato et al. |
| 10,784,853 B2 | 9/2020 | Leong |
| 10,979,032 B1 | 4/2021 | Leong et al. |
| 11,088,688 B2 | 8/2021 | Pala |
| 2006/0145744 A1 | 7/2006 | Diorio et al. |
| 2009/0167411 A1 | 7/2009 | Machida et al. |
| 2009/0206363 A1 | 8/2009 | Machida et al. |
| 2010/0155775 A1 | 6/2010 | Gauthier et al. |
| 2012/0217542 A1 | 8/2012 | Morita |
| 2012/0262220 A1 | 10/2012 | Springett |
| 2012/0287688 A1 | 11/2012 | Fornage et al. |
| 2014/0145208 A1 | 5/2014 | Rose et al. |
| 2014/0197448 A1 | 7/2014 | Galy et al. |
| 2014/0203289 A1 | 7/2014 | Liu et al. |
| 2014/0264431 A1 | 9/2014 | Lal |
| 2014/0374766 A1 | 12/2014 | Bahl et al. |
| 2015/0043116 A1 | 2/2015 | Weyers et al. |
| 2015/0180469 A1 | 6/2015 | Kim |
| 2015/0256163 A1 | 9/2015 | Weis |
| 2016/0079233 A1 | 3/2016 | Deboy et al. |
| 2016/0322485 A1 | 11/2016 | Padmanabhan et al. |
| 2017/0047841 A1 | 2/2017 | Zojer et al. |
| 2017/0062419 A1 | 3/2017 | Rose et al. |
| 2017/0103978 A1 | 4/2017 | Prechtl et al. |
| 2017/0338809 A1 | 11/2017 | Stefanov et al. |
| 2018/0219008 A1 | 8/2018 | Prechtl et al. |
| 2019/0068181 A1* | 2/2019 | Leong .................. H03K 17/161 |
| 2019/0199289 A1* | 6/2019 | Wei ........................ H03F 3/195 |
| 2019/0252921 A1* | 8/2019 | Lethellier ............... H01F 38/14 |
| 2019/0326280 A1* | 10/2019 | Imam ................ H01L 29/42316 |
| 2020/0098745 A1 | 3/2020 | Roig-Guitart |
| 2020/0287536 A1 | 9/2020 | Udrea et al. |
| 2022/0157981 A1 | 5/2022 | Gupta et al. |

FOREIGN PATENT DOCUMENTS

| | | |
|---|---|---|
| EP | 3249815 A1 | 11/2017 |
| TW | 200541073 A | 12/2005 |
| WO | 2005002054 A1 | 1/2005 |
| WO | 2017159559 A1 | 9/2017 |
| WO | 2021206065 A1 | 10/2021 |

OTHER PUBLICATIONS

Chen, Ren-Yi, et al., "Study and Implementation of a Current-Fed Full-Bridge Boost DC-DC Converter With Zero-Current Switching for High-Voltage Applications", IEEE Transactions on Industry Applications, vol. 44, No. 4, Jul./Aug. 2008, 1218-1226.

Friedli, Thomas, et al., Design and Performance of a 200-KHz All-SiC JFET Current DC-Link Back-to-Back Converter, IEEE Transactions on Industry Applications, vol. 45, No. 5, Sep./Oct. 2009, 1868-1878.

Kolar, J.W., et al., "Novel Three-Phase AC-DC-AC Sparse Matrix Converter", IEEE, 2002, 777-787.

Lindemann, A., "A New IGBT with Reverse Blocking Capability", Entwurf fuer EPE Conference, European Conference on Power Electronics and Applications, Graz, Austria, 2001, Posted to Internet on Sep. 11, 2014, 2001, pp. 1-7.

Siemaszko, Daniel, et al., "Active Self-Switching Methods for Emerging Monolithic Bidirectional Switches Applied to Diode-Less Converters", 2009 13th European Conference on Power Electronics and Applications, Sep. 8-10, 2009, 1-9.

Soeiro, Thiago B., et al., "Three-Phase Modular Multilevel Current Source Rectifiers For Electric Vehicle Battery Charging Systems", IEEE, 2013, 623-629.

Haehre, K., et al., "Switching Speed-Control of an Optimized Capacitor-Clamped Normally-On Silicon Carbide JFET Cascode", 15th International Power Electronics and Motion Control Conference, EPE-PEMC 2012 ECCE Europe, Novi Sad, Serbia, Sep. 4, 2012, pp. DS1a.11-1-DS1a.11-5.

Chowdhury, Dilder, "GaN FETs: Why cascode?", Sep. 30, 2020, pp. 1-6.

Li, Xueqing, et al., "Medium Voltage Power Module Based on SiC JFETs", IEEE Applied Power Electronics Conference and Exposition (APEC), Mar. 26, 2017, pp. 3033-3037.

Oladele, Olanrewaju Kabir, et al., "Optimizing Switching Performance of Cascade-Light SiC JFET Bidirectional Switch for Matrix Converter", IEEE International Power Electronics and Application Conference and Exposition (PEAC), 2018, pp. 1-6.

* cited by examiner

AUTOMATIC REVERSE BLOCKING BIDIRECTIONAL SWITCH

BACKGROUND

In various current source rectifiers, inverters, current fed converters and some types of matrix converters, devices with bidirectional blocking capability where active control of only one blocking direction is required. However, these devices suffer from high conduction losses, including due to forward diode voltage.

SUMMARY

According to an embodiment of a monolithically integrated bidirectional switch, the monolithically integrated bidirectional switch comprises: an input terminal; an output terminal; a control terminal; a compound semiconductor substrate; a common drift region in the compound semiconductor substrate and in series between the input terminal and the output terminal; a first gate; and a second gate, wherein the first gate is electrically connected to the control terminal and the second gate is electrically connected to the input terminal, such that the monolithically integrated bidirectional switch is configured to block voltages of both polarities and conduct current in a single direction from the input terminal to the output terminal through the common drift region via active control of the first gate.

According to another embodiment of a monolithically integrated bidirectional switch, the monolithically integrated bidirectional switch comprises: an input terminal; an output terminal; a control terminal; a compound semiconductor substrate; a common drift region in the compound semiconductor substrate and in series between the input terminal and the output terminal; a first gate; and a second gate, wherein one of the first gate and the second gate is a normally-on gate and the other one of the first gate and the second gate is a normally-off gate, such that the monolithically integrated bidirectional switch is configured to conduct current in a single direction from the input terminal to the output terminal through the common drift region.

According to an embodiment of an electronic system, the electronic system comprises: a power converter having an input side and an output side; and a rectification or inverter circuit between the input side and the output side of the power converter, the rectification or inverter circuit comprising one or more phases, wherein each phase of the rectification or inverter circuit comprises a first monolithically integrated bidirectional switch electrically connected in series with a second monolithically integrated bidirectional switch at a phase node, wherein each first monolithically integrated bidirectional switch and each second monolithically integrated bidirectional switch comprises: an output terminal; a control terminal; a compound semiconductor substrate; a common drift region in the compound semiconductor substrate and in series between the input terminal and the output terminal; a first gate; and a second gate, wherein the first gate is electrically connected to the control terminal and the second gate is electrically connected to the input terminal, or one of the first gate and the second gate is a normally-on gate and the other one of the first gate and the second gate is a normally-off gate, such that the monolithically integrated bidirectional switch is configured to conduct current in a single direction from the input terminal to the output terminal through the common drift region.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments may be combined unless they exclude each other. Embodiments are depicted in the drawings and are detailed in the description that follows.

DETAILED DESCRIPTION

The embodiments described herein provide a monolithically integrated (dual-gate) bidirectional switch configured to mitigate or eliminate forward diode voltage. The monolithically integrated bidirectional switch has bipolar blocking capability, where the same drift region is used for blocking in both directions, yielding lower conduction losses than a series connection of two high-voltage devices. The monolithically integrated bidirectional switch may be operated by active control of both gates with only a single external signal, or by passive control of one gate, e.g., via a diode cascode configuration without sensing which reduces complexity.

Described next, with reference to the figures, are exemplary embodiments of the monolithically integrated bidirectional switch and a corresponding electronic system that uses the monolithically integrated bidirectional switch.

Figure 1:
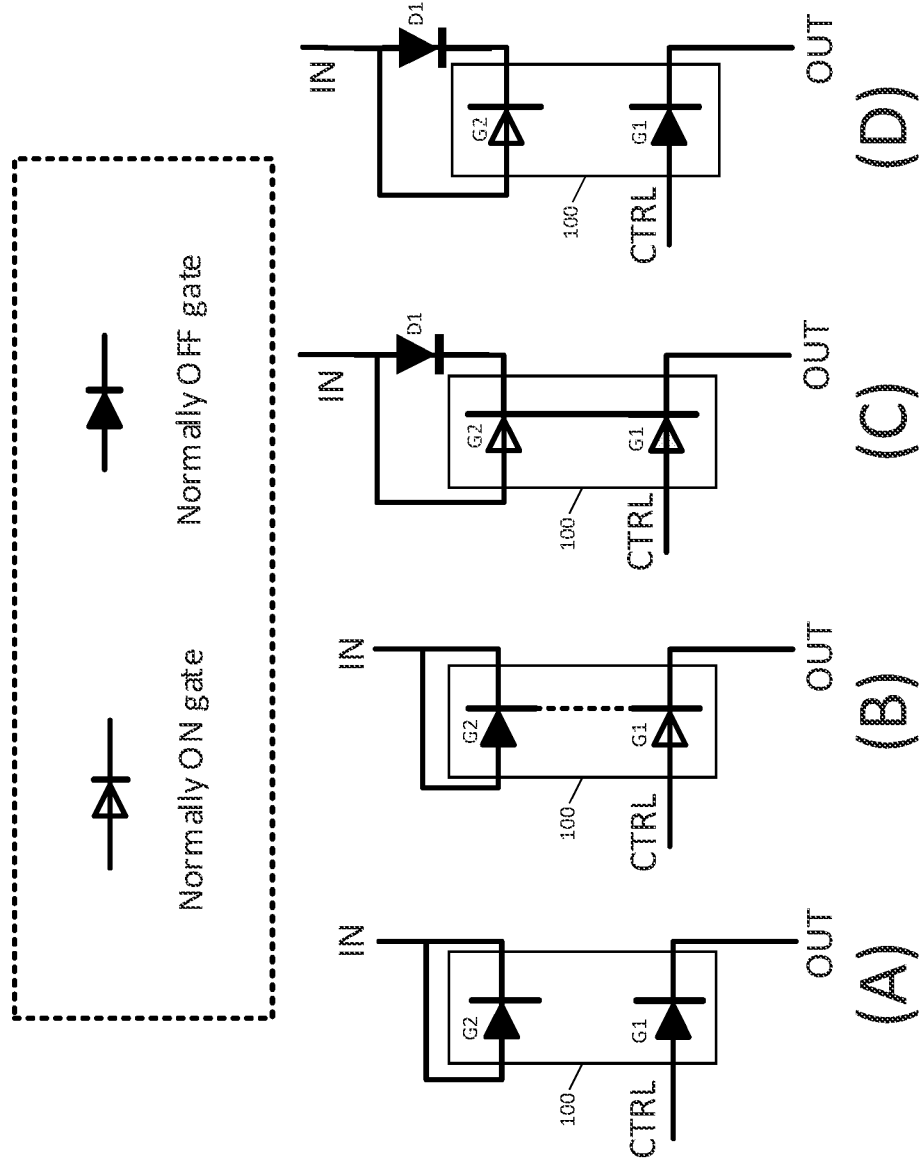
FIG. 1 illustrates circuit schematics of four different embodiments of a monolithically integrated bidirectional switch.

FIG. 1 illustrates four different embodiments (A through D) of the monolithically integrated bidirectional switch. In each embodiment, the bidirectional switch is 'monolithically integrated' in that the bidirectional switch has two gates integrated in the same semiconductor substrate. The monolithically integrated bidirectional switch includes an input terminal 'IN', an output terminal 'OUT', a control terminal 'CTRL', a compound semiconductor substrate 100 such as, e.g., a GaN substrate, a common drift region in the compound semiconductor substrate 100 and in series between the input terminal IN and the output terminal OUT, a first gate 'G1', and a second gate 'G2'. Both gates G1, G2 may be normally-on gates (embodiment C), normally-off gates (embodiment A), or one normally-on gate and one normally-off gate (embodiments B and D). For a normally-on gate, a current conduction channel is present between the input terminal IN and the output terminal OUT absent any voltage being applied to the control terminal CTRL. For a normally-off gate, a current conduction channel is not present between the input terminal IN and the output terminal OUT without a suitable voltage applied to the control terminal CTRL. The upper part of FIG. 1 distinguishes between a normally-on gate and a normally-off gate by using different symbols.

Figure 2:
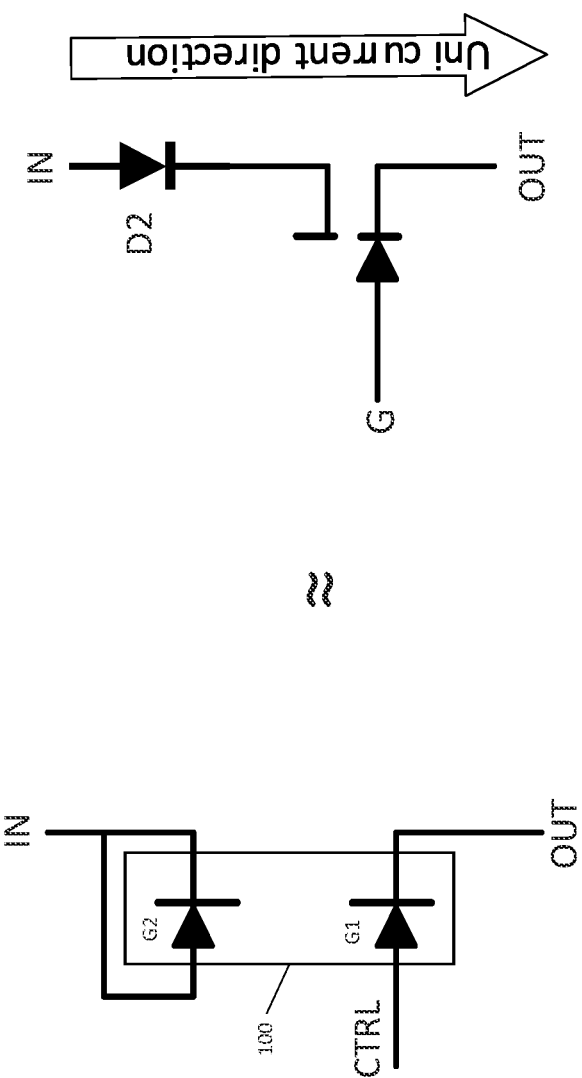
FIG. 2 illustrates an equivalent diagram of embodiment A of the monolithically integrated bidirectional switch shown in FIG. 1.

According to embodiments A and C of the monolithically integrated bidirectional switch, the first gate G1 is electrically connected to the control terminal CTRL and the second gate G2 is electrically connected to the input terminal IN. Further according to embodiments A and C of the monolithically integrated bidirectional switch, the first and second gates G1, G2 are symmetrical in that both gates G1, G2 are either normally-off gates (embodiment A) or normally-on gates (embodiment C). In either case, the monolithically integrated bidirectional switch of embodiments A and C blocks voltages of both polarities (+V, −V) across the input and output terminals IN, OUT and conducts current in a single direction from the input terminal IN to the output terminal OUT through the common drift region of the compound semiconductor substrate 100 via active control of the first gate G1, as illustrated in FIG. 2 (embodiment A) and FIG. 3 (embodiment C).

According to embodiment A of the monolithically integrated bidirectional switch, the first gate G1 is a normally-off gate and the second gate G2 is a normally-off gate. The second gate G2, which is electrically connected to the input terminal IN in a gated diode configuration (i.e., gate connected to source) in embodiment A, behaves as a normally-off discrete switch plus a cascaded diode 'D2', as illustrated in FIG. 2. That is, the second gate G2 is shorted to the corresponding source to create a gated diode which is effectively the G2 gate modulated through the source to source voltage to turn on. The equivalent circuit shown in FIG. 2 is a normally-off discrete GaN in series with a reverse blocking diode D2. The device has only one (common) drift region to sustain high voltages and therefore has lower conduction losses, and passively blocks voltages in both directions but actively allows current flow in only one direction. No additional conduction losses occur because only a single (common) drift region is used instead of two different drift regions. Accordingly, the monolithically integrated bidirectional switch has one region where voltage is blocked in both directions but with active turn on of the first gate G1 to conduct current, where the first gate G1 functions as an externally controllable gate 'G' of the monolithically integrated bidirectional switch in embodiment A.

According to embodiment C of the monolithically integrated bidirectional switch, the first gate G1 is a normally-on gate, the second gate G2 is a normally-on gate, and the second gate G2 is electrically connected to the input terminal IN via a discrete diode 'D1' or a diode D1 that is monolithically integrated with the bidirectional switch. Embodiment C is similar to embodiment A, but with the monolithically integrated bidirectional switch being a normally-on device having a diode cascode configuration.

The normally-on gates G1, G2 of embodiment C always conduct which removes a Vth (threshold voltage) drop from the conduction losses and adds a diode D1 in series with the second gate G2. The diode D1 enables current flowing in the forward direction and in the reverse direction enables to sustain a blocking voltage applied across the source and gate of the normally-on bidirectional switch. The voltage automatically turns off the second gate G2. The diode D1 may be a low voltage diode such as a discrete Si (silicon) Schottky diode such that the blocking voltage is similar to the gate voltage for normally-on devices. When the overall device sees a voltage in the reverse direction, the voltage drop across the diode D1 pulls the voltage of the second normally-on gate G2 negative in the illustrated cascode configuration, turning off the monolithically integrated bidirectional switch of embodiment C. The monolithically integrated bidirectional switch of embodiment C may be forced off by applying a negative voltage to the first gate G1 which functions as the externally controllable gate G of the monolithically integrated bidirectional switch.

Figure 3:
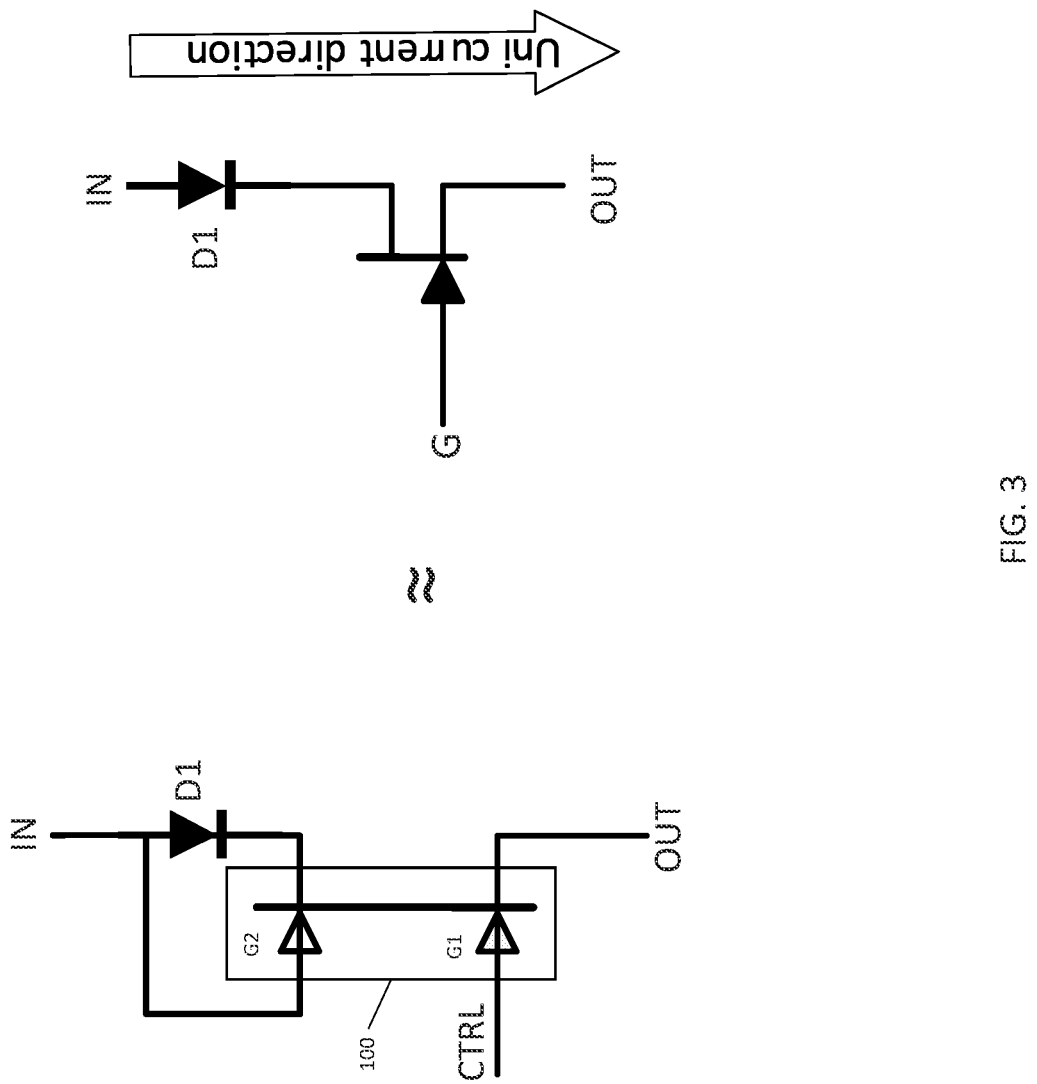
FIG. 3 illustrates an equivalent diagram of embodiment C of the monolithically integrated bidirectional switch shown in FIG. 1.

The monolithically integrated bidirectional switch of embodiment C conducts when a positive voltage is applied to the device, with the conduction losses coming from RDSON (on-state resistance) of the normally-on gates G1, G2 and the relatively small voltage drop of the diode D1. Accordingly, there is no forward voltage drop associated with the gates G1, G2, but instead just the relatively low forward voltage drop of the cascaded diode D1, as illustrated in FIG. 3. The diode D1 may be implemented in a different technology than the compound semiconductor substrate 100 of the monolithically integrated bidirectional switch to provide a relatively low voltage drop. For example, the diode D1 may be a Si diode and the compound semiconductor substrate 100 of the monolithically integrated bidirectional switch may be a GaN substrate. If the diode D1 is implemented in a different technology than the compound semiconductor substrate 100 of the monolithically integrated bidirectional switch, the diode D1 may be a discrete device or co-packaged with the monolithically integrated bidirectional switch. The second gate G2 may be electrically connected to the input terminal IN via a transistor device instead of a diode, the transistor device being electrically connected to the second gate G2 in a cascode configuration.

The equivalent circuit shown in FIG. 3 is a normally-on discrete GaN in series with a reverse blocking diode D1. The device passively blocks voltages in the reverse polarities but only actively blocks voltage in the forward direction.

Figure 4:
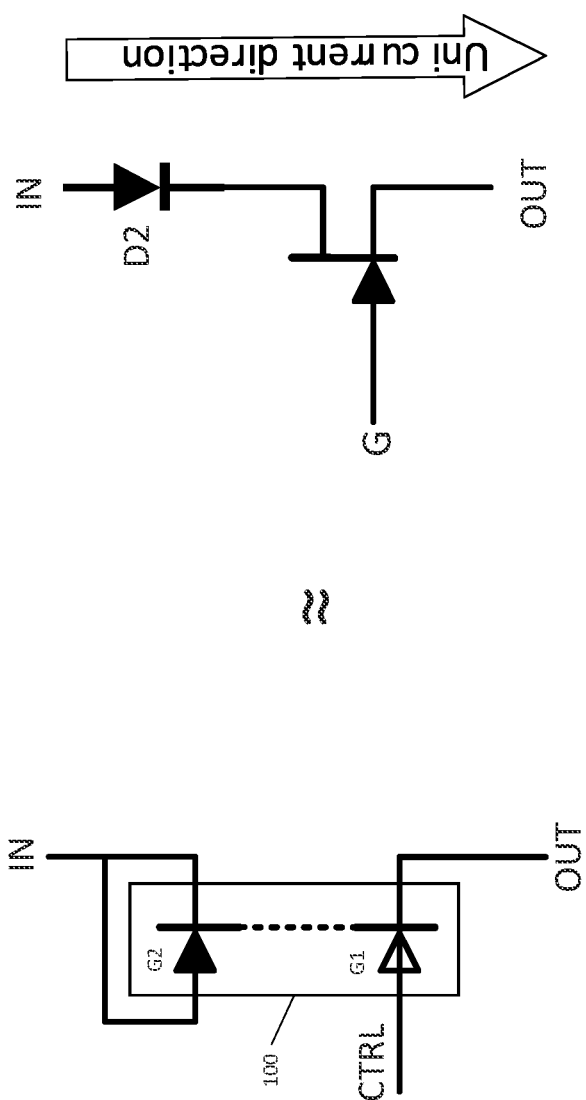
FIG. 4 illustrates an equivalent diagram of embodiment B of the monolithically integrated bidirectional switch shown in FIG. 1.

According to embodiments B and D of the monolithically integrated bidirectional switch, the first and second gates G1, G2 are asymmetric. That is, one of the first gate G1 and the second gate G2 is a normally-on gate and the other one of the first gate G1 and the second gate G2 is a normally-off gate. The monolithically integrated bidirectional switch of embodiments B and D conducts current in a single direction from the input terminal IN to the output terminal OUT through the common drift region of the compound semiconductor substrate 100, as indicated in FIG. 4 (embodiment B) and FIG. 5 (embodiment D). The monolithically integrated bidirectional switch may be actively controlled to block in both directions in embodiment B and D, e.g., via the externally accessible gate 'G' formed by the first gate G1.

According to embodiment B of the monolithically integrated bidirectional switch, the first gate G1 is a normally-on gate and the second gate G2 is a normally-off gate. The second gate G2 is electrically connected to the input terminal IN in a gated diode configuration. Accordingly, the monolithically integrated bidirectional switch behaves like a normally-on switch in series with diode in embodiment B. In one direction, the monolithically integrated bidirectional switch acts as a diode and actively turns off. In the opposite direction, the monolithically integrated bidirectional switch is fully blocking. Hence, the monolithically integrated bidirectional switch of embodiment B is always blocking in both directions and always conducting current unless actively turned off, as illustrated in FIG. 4.

The equivalent circuit shown in FIG. 4 is a normally-on discrete GaN in series with a reverse blocking diode D2. The structure has only one (common) drift region and therefore lower conduction losses is expected compared to using discrete components. The equivalent circuit shown in FIG. 4 is a normally-on device in one direction but can be actively controlled to turn off and also fully blocking in the reverse polarity.

According to embodiment D of the monolithically integrated bidirectional switch, the first gate G1 is a normally-off gate, the second gate G2 is a normally-on gate, and the second gate G2 is electrically connected to the input terminal IN via a discrete diode or a diode D1 that is monolithically integrated with the bidirectional switch. Embodiment D is similar to embodiment C, but the first gate G1 which forms the externally accessible/controllable gate G of the monolithically integrated bidirectional switch is a normally-off gate instead of a normally-on gate. Hence, the monolithically integrated bidirectional switch of embodiment D conducts current in one direction but only when a sufficient voltage is applied to the first gate G1, as illustrated in FIG. 5.

Figure 5:
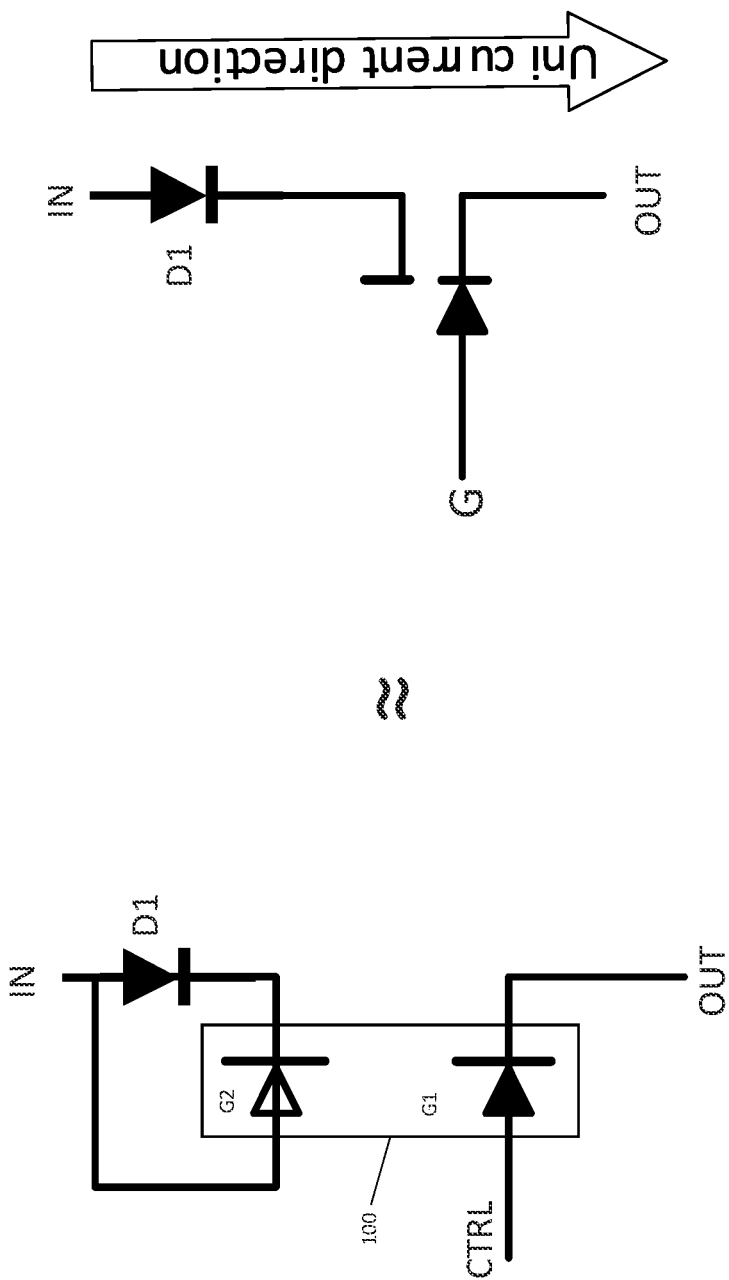
FIG. 5 illustrates an equivalent diagram of embodiment D of the monolithically integrated bidirectional switch shown in FIG. 1.

The equivalent circuit shown in FIG. 5 is a normally-off discrete GaN in series with a reverse blocking diode, the same as in FIG. 3. In FIG. 5, however, the first gate G1 is normally-off and the bidirectional switch device passively blocks voltages in both polarities but actively allows current through in one direction only.

Described next are embodiments of synchronous rectification circuits for use with the monolithically integrated bidirectional switch embodiments in FIG. 1 having a normally-off second gate G2 (embodiments A and B).

Figure 6:
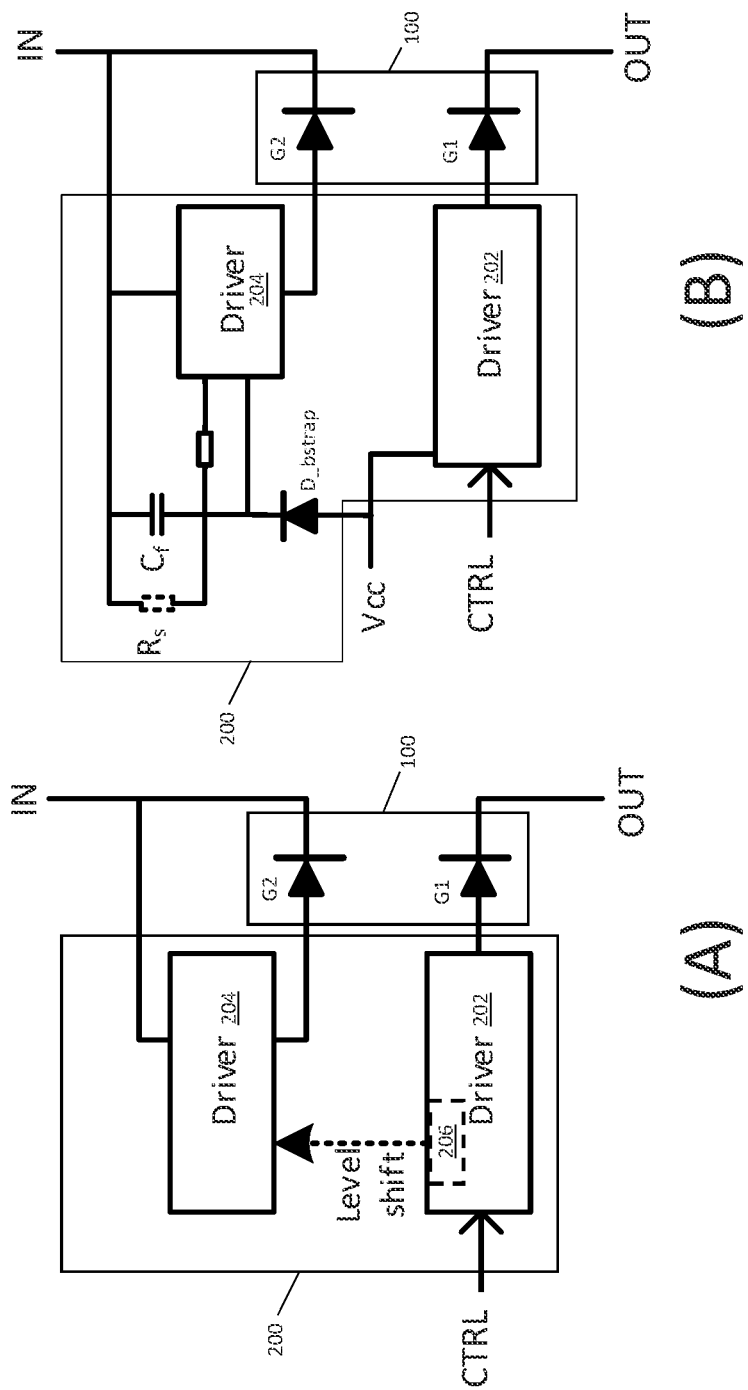
FIG. 6 illustrates two embodiments of synchronous rectification circuits for use with the monolithically integrated bidirectional switch of embodiment A in FIG. 1.

FIG. 6 illustrates two embodiments of synchronous rectification circuits for use with the monolithically integrated bidirectional switch of embodiment A in FIG. 1. According to both synchronous rectification circuit embodiments shown in FIG. 6, the monolithically integrated bidirectional switch of embodiment A further includes a synchronous rectification circuit 200 that turns on the second gate G2 when the first gate G1 is on. By connecting the second gate G2 to the source, the gated diode basically turns the active switch into a pure diode behavior. However, when conducting current, a diode forward threshold voltage is impressed and therefore increases conduction losses. The synchronous rectification circuit 200 eliminates this forward threshold voltage.

According to embodiment A of the synchronous rectification circuit 200 shown in FIG. 6, both gates G1, G2 have a corresponding driver 202, 204 and the synchronous rectification circuit 200 also includes a level shifter 206 electrically connected to the driver 204 for the second gate G2. The synchronous rectification circuit 200 effectively is a bootstrap and the level shifter 206 accounts for the floating potential of the compound semiconductor substrate 100, ensuring a proper gate drive for the second gate G2 and achieving synchronous rectification by turning on the second (floating) driver 204 whenever the first gate G1 is on.

According to embodiment B of the synchronous rectification circuit 200 shown in FIG. 6, the synchronous rectification circuit 200 includes a bootstrap capacitor Cf having a first plate electrically connected to the input terminal IN and a second plate electrically connected to the driver 204 for the second gate G2, and a bootstrap diode D_bstrap having an anode electrically connected to a voltage supply node Vcc and a cathode electrically connected to the second plate of the bootstrap capacitor Cf. The synchronous rectification circuit 200 of embodiment B may further include a resistor Rs in parallel with the bootstrap capacitor Cf. The second (floating) driver 604 is turned on whenever the first gate G1 turns on the device brings the floating source (drain) node to ground. The parallel resistor Rs with the bootstrap capacitor Cf ensures the second driver 604 turns back off when the first gate G1 is off.

Figure 7:
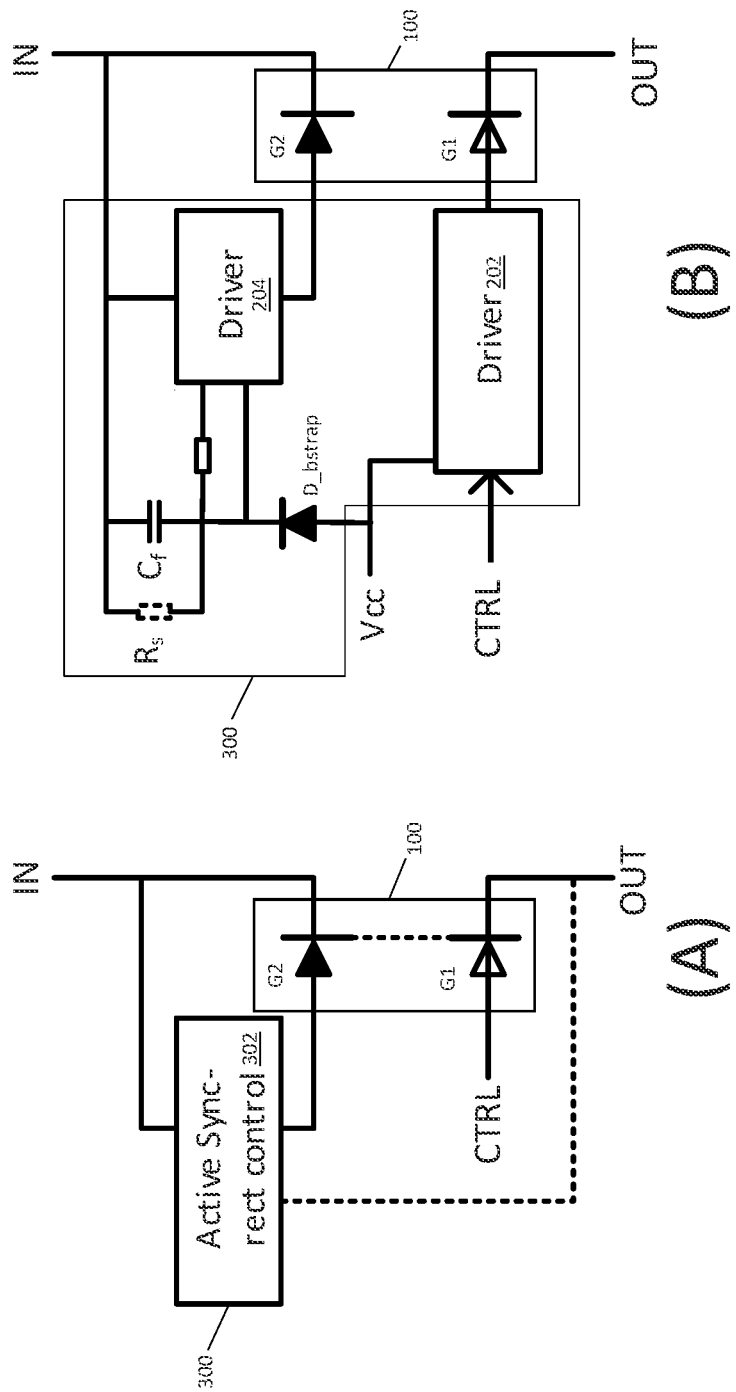
FIG. 7 illustrates two embodiments of synchronous rectification circuits for use with the monolithically integrated bidirectional switch of embodiment B in FIG. 1.

FIG. 7 illustrates two embodiments of synchronous rectification circuits for use with the monolithically integrated bidirectional switch of embodiment B in FIG. 1. According to both synchronous rectification circuit embodiments shown in FIG. 7, the monolithically integrated bidirectional switch of embodiment B further includes a synchronous rectification circuit 300 that turns on the second gate G2 when current is flowing through the first gate G1. For the asymmetrical gate embodiment B with normally-on gate G1 for active control and the gated diode on one side, the two gate signals may not be the same and therefore cannot be driven by the same signal. For active synchronous rectification, a self-sensing control is provided.

According to embodiment A of the synchronous rectification circuit 300 shown in FIG. 7, the synchronous rectification circuit 300 includes an active synchronous rectification circuit 302 with self-sensing control. For example, the active synchronous rectification circuit 302 may sense the source to source voltage and turn on the second gate G2 if the sensed source to source voltage is positive and turn off the second gate G2 when the sensed source voltage is negative.

According to embodiment B of the synchronous rectification circuit 300 shown in FIG. 7, the synchronous rectification circuit 300 includes a bootstrap capacitor Cf having a first plate electrically connected to the input terminal IN and a second plate electrically connected to the driver for the second gate G2, and a bootstrap diode B_bstrap having an anode electrically connected to a voltage supply node Vcc and a cathode electrically connected to the second plate of the bootstrap capacitor Cf. The synchronous rectification circuit 200 of embodiment B may further include a resistor Rs in parallel with the bootstrap capacitor Cf.

Figure 8:
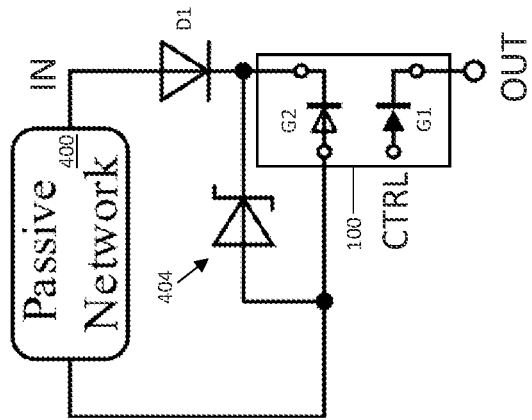
FIG. 8 illustrates three passive network embodiments for use with the monolithically integrated bidirectional switch of embodiment D in FIG. 1.
Figure 8:
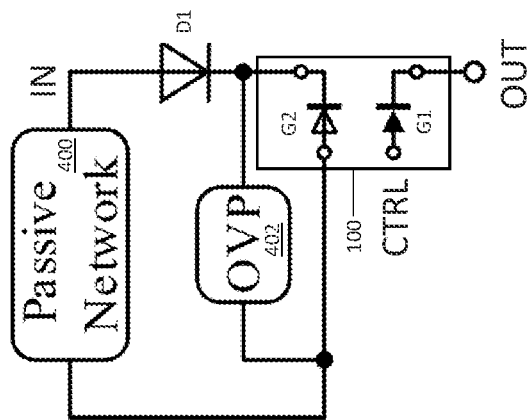
Figure 8:
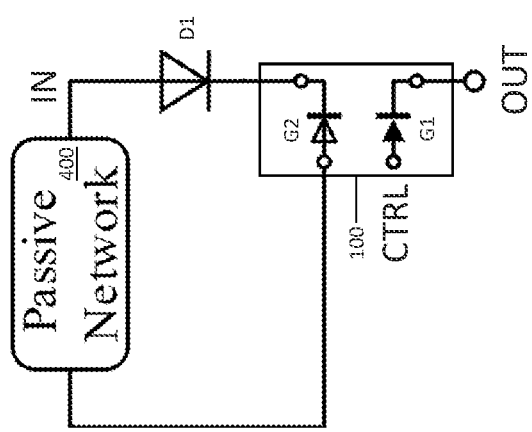

FIG. 8 illustrates three passive network embodiments for use with the monolithically integrated bidirectional switch of embodiments B and D in FIG. 1. According to embodiment A in FIG. 8, a passive network 400 is electrically coupled in series or in parallel between the diode D1 and the normally-on second gate G2 of the monolithically integrated bidirectional switch. The passive network 400 aids the switching behaviour of the monolithically integrated bidirectional switch. According to embodiment B in FIG. 8, an overvoltage protection (OVP) circuit 402 is also provided. The OVP circuit limits the voltage applied to the diode D1, thus protecting the diode D1 from excessive reverse voltage conditions. According to embodiment C in FIG. 8, a Zener diode 404 is provided for guarding against excessive reverse voltages on diode D1.

FIGS. 9 through 12 illustrate cross-sectional device views of the monolithically integrated bidirectional switch shown in FIG. 1, according to different embodiments.

Figure 9:
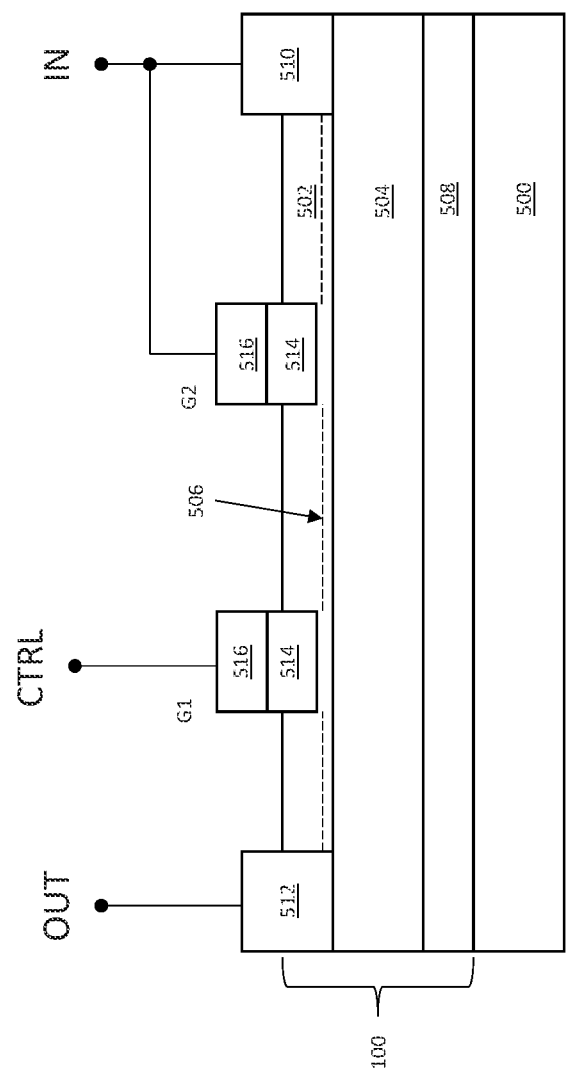
FIG. 9 illustrates a device embodiment for the monolithically integrated bidirectional switch of embodiment A in FIG. 1.

FIG. 9 illustrates a device embodiment for the monolithically integrated bidirectional switch of embodiment A in FIG. 1. The compound semiconductor substrate 100 is a GaN substrate in this case, formed on a Si substrate 500. The compound semiconductor substrate 100 includes a barrier layer 502 and a buffer layer 504 disposed below the barrier layer 502. The barrier layer 502, which forms the common drift region of the compound semiconductor substrate 100, comprises type III-V semiconductor material and the buffer layer 504 comprises type III-V semiconductor material with a different bandgap as the barrier layer 502. For instance, the buffer layer 504 may comprise GaN or AlGaN and the barrier layer 502 can comprise AlGaN with a higher aluminum content as the buffer layer 504. The buffer layer 504 forms a heterojunction with the barrier layer 502 such that a two-dimensional charge carrier gas 506 is disposed in the buffer layer 502 near the heterojunction interface. The term two-dimensional charge carrier gas 506 channel refers to a two-dimensional electron gas ("2DEG") or a two-dimensional hole gas ("2DHG"). In the above example wherein the buffer layer 504 is a GaN layer and the barrier layer 502 is a layer of AlGaN, the two-dimensional charge carrier gas 506 is a 2DEG.

The compound semiconductor substrate 100 may additionally include a back-barrier region 508 disposed below the buffer layer 504. The back-barrier region 508 may comprise multiple layers of different semiconductor material that serve different purposes. For instance, the back-barrier region 508 may comprise a plurality of type III-V semiconductor layers on the base Si substrate 500. These type III-V semiconductor layers may have different crystalline properties, e.g., layers of GaN/AlGaN with different aluminum content, that are designed to alleviate mechanical stresses in the compound semiconductor substrate 100 resulting from lattice mismatch between the base Si substrate 500 and the III-V semiconductor material. The input and output terminals IN, OUT may be implemented by respective metal contacts 510, 512, e.g., which contact the two-dimensional charge carrier gas 506 at opposite ends.

According to embodiment A of the monolithically integrated bidirectional switch of FIG. 1, the first gate G1 is a normally-off gate and the second gate G2 is a normally-off gate. Accordingly, the two-dimensional charge carrier gas 506 is interrupted beneath both gates G1, G2. The first and second gates G1, G2 may be formed as normally-off gates by recessing the buffer layer 502 in the gate areas deep enough to interrupt the dimensional charge carrier gas 506 in the gate areas and forming the gates G1, G2 in the recessed regions. Each gate G1, G2 may include a gate dielectric 514 such as silicon dioxide, silicon nitride, silicon oxynitride, etc. separating the corresponding gate electrode 516 from the buffer layer 502.

Figure 10:
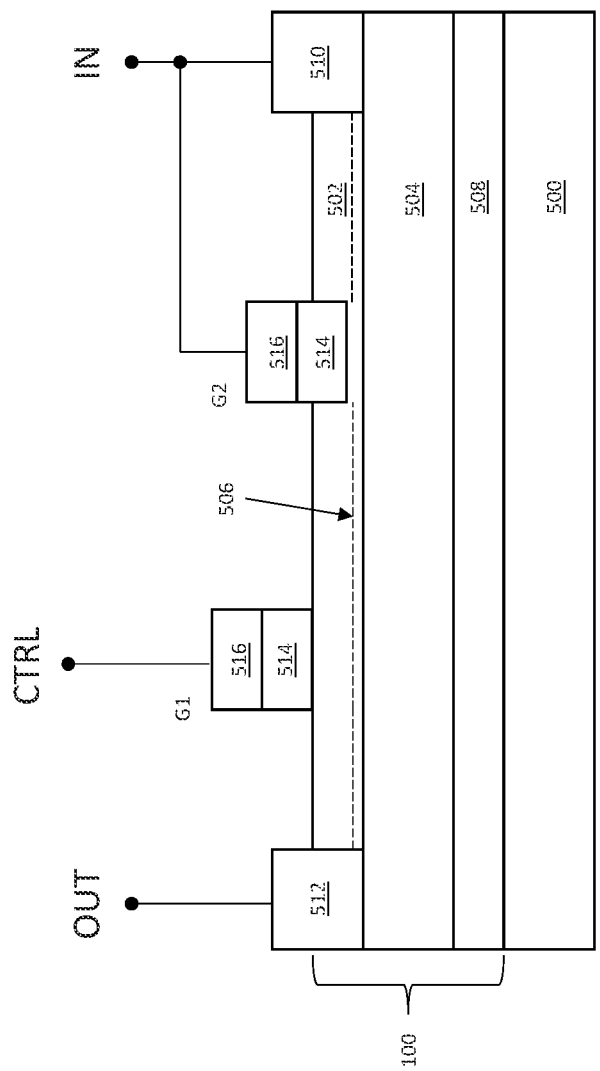
FIG. 10 illustrates a device embodiment for the monolithically integrated bidirectional switch of embodiment B in FIG. 1.

FIG. 10 illustrates a device embodiment for the monolithically integrated bidirectional switch of embodiment B in FIG. 1. The device embodiment illustrated in FIG. 10 is similar to the device embodiment illustrated in FIG. 9. Different, however, the first gate G1 is a normally-on gate for embodiment B of the monolithically integrated bidirectional switch in FIG. 1. Accordingly, the two-dimensional charge carrier gas 506 is interrupted beneath the second gate G2 but not beneath the first gate G1. The second gate G2 may be formed as normally-off gate by recessing the buffer layer 502 in the corresponding gate area deep enough to interrupt the dimensional charge carrier gas 506 in the area of the second gate G2 and forming the second gate G2 in the recessed region. The first gate area may be masked during the recess process, to ensure the first gate G1 is not recessed and therefore a normally-on gate.

Figure 11:
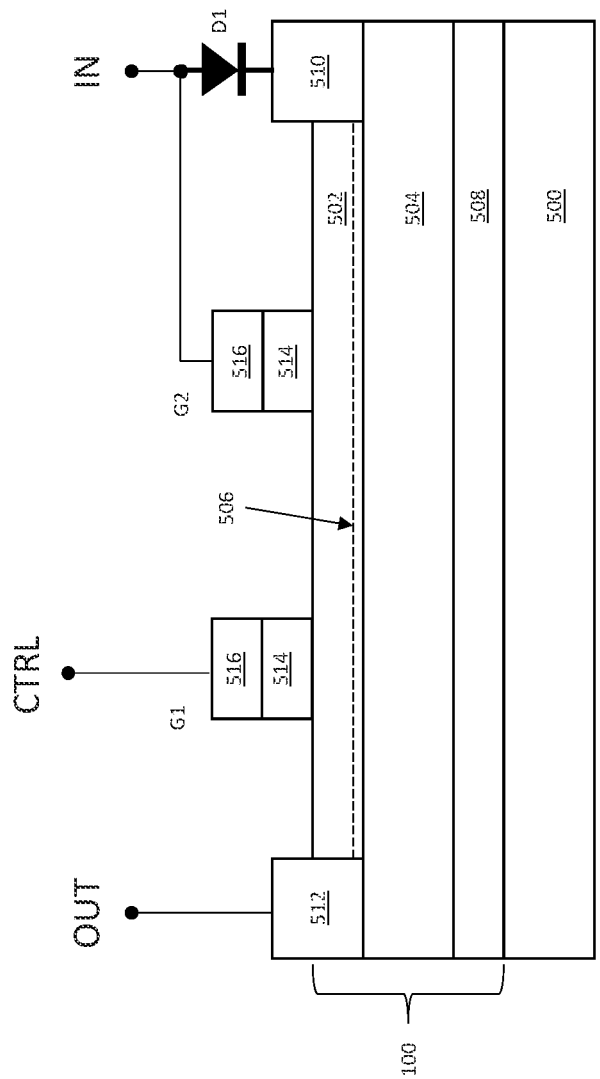
FIG. 11 illustrates a device embodiment for the monolithically integrated bidirectional switch of embodiment C in FIG. 1.

FIG. 11 illustrates a device embodiment for the monolithically integrated bidirectional switch of embodiment C in FIG. 1. The device embodiment illustrated in FIG. 11 is similar to the device embodiment illustrated in FIG. 10. Different, however, both gates gate G1, G2 are normally-on gates for embodiment C of the monolithically integrated bidirectional switch in FIG. 1. Accordingly, neither gate area is recessed and the two-dimensional charge carrier gas 506 extends uninterrupted beneath both gates G1, G2. Also, the monolithically integrated bidirectional switch of embodiment C in FIG. 1 also includes a diode D1 in series with the second gate G2 of the monolithically integrated bidirectional switch. As explained above in connection with FIGS. 1, 3 and 5, the diode D1 in series with the second gate G2 may be a discrete diode D1 or a diode D1 that is monolithically integrated with the bidirectional switch. Instead of a diode, the second gate G2 may be electrically connected to the input terminal via IN a transistor device electrically connected to the second gate G2 in a cascode configuration, also as previously described herein.

Figure 12:
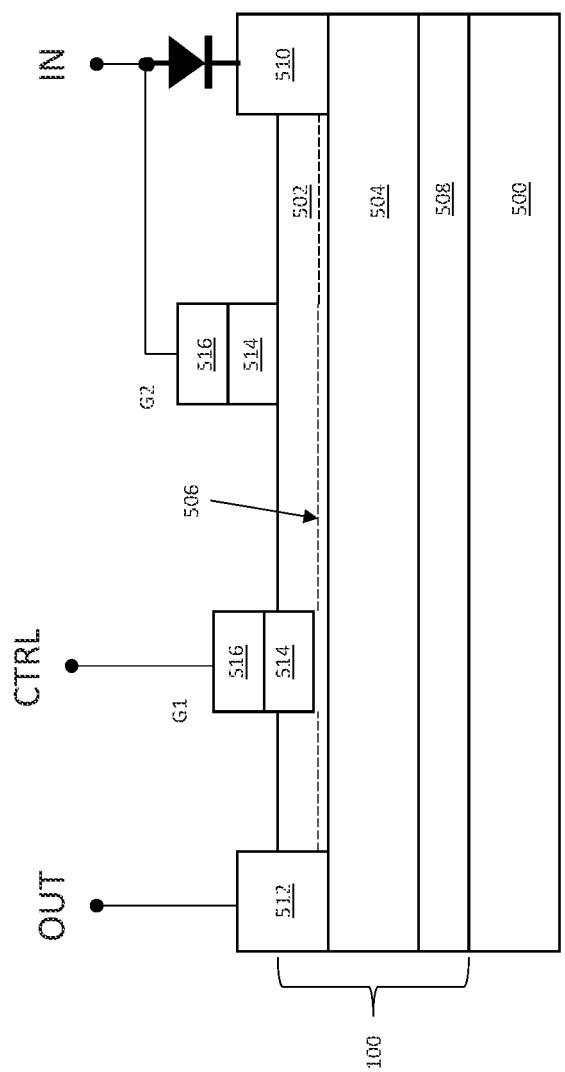
FIG. 12 illustrates a device embodiment for the monolithically integrated bidirectional switch of embodiment D in FIG. 1.

FIG. 12 illustrates a device embodiment for the monolithically integrated bidirectional switch of embodiment D in FIG. 1. The device embodiment illustrated in FIG. 12 is similar to the device embodiment illustrated in FIG. 11. Different, however, the first gate G1 is a normally-off gate and the second gate G2 is a normally-on gate for embodiment D of the monolithically integrated bidirectional switch in FIG. 1. Accordingly, the two-dimensional charge carrier gas 506 is interrupted beneath the first gate G1 but not beneath the second gate G2. The first gate G1 may be formed as normally-off gate by recessing the buffer layer 502 in the corresponding gate area deep enough to interrupt the dimensional charge carrier gas 506 in the area of the first gate G1 and forming the first gate G1 in the recessed region. The second gate area may be masked during the recess process, to ensure the second gate G2 is not recessed and therefore a normally-on gate.

Figure 13:
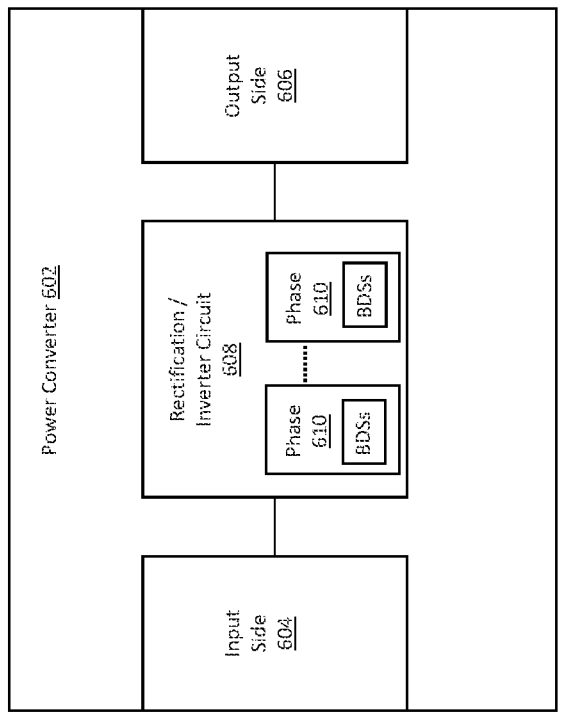
FIG. 13 illustrates an embodiment of an electronic system that includes the monolithically integrated bidirectional switch.

FIG. 13 illustrates an embodiment of an electronic system 600 that includes the monolithically integrated bidirectional switch (BDS) described herein. The electronic system 600 also includes a power converter 602 having an input side 604 and an output side 606 and a rectification or inverter circuit 608 between the input side 604 and the output side 606 of the power converter 602. The rectification or inverter circuit 608 has one or more phases 610, where each phase 610 of the rectification or inverter circuit 608 includes a first monolithically integrated bidirectional switch of the kind described herein and electrically connected in series with a second monolithically integrated bidirectional switch of the kind described herein at a phase node. Each first monolithically integrated bidirectional switch and each second monolithically integrated bidirectional switch includes an input terminal IN, an output terminal OUT, a control terminal CTRL, a compound semiconductor substrate 100, a common drift region in the compound semiconductor substrate 100 and in series between the input terminal IN and the output terminal OUT, a first gate G1, and a second gate G2.

For the monolithically integrated bidirectional switch embodiments A and C in FIG. 1, the first gate G1 is electrically connected to the control terminal CTRL and the second gate G2 is electrically connected to the input terminal IN. For the monolithically integrated bidirectional switch embodiments B and D in FIG. 1, one of the first gate G1 and the second gate G2 is a normally-on gate and the other one of the first gate G1 and the second gate G2 is a normally-off gate. For each monolithically integrated bidirectional switch, the monolithically integrated bidirectional switch conducts current in a single direction from the input terminal IN to the output terminal OUT through the common drift region of the compound semiconductor substrate 100. The electronic system 600 may be, e.g., a current source rectifier, an inverter, a current fed converter, a matrix converter, etc.

Although the present disclosure is not so limited, the following numbered examples demonstrate one or more aspects of the disclosure.

Example 1. A monolithically integrated bidirectional switch, comprising: an input terminal; an output terminal; a control terminal; a compound semiconductor substrate; a common drift region in the compound semiconductor substrate and in series between the input terminal and the output terminal; a first gate; and a second gate, wherein the first gate is electrically connected to the control terminal and the second gate is electrically connected to the input terminal, such that the monolithically integrated bidirectional switch is configured to block voltages of both polarities and conduct current in a single direction from the input terminal to the output terminal through the common drift region via active control of the first gate.

Example 2. The monolithically integrated bidirectional switch of example 1, wherein the first gate is a normally-off gate, and wherein the second gate is a normally-off gate.

Example 3. The monolithically integrated bidirectional switch of example 2, further comprising a synchronous rectification circuit configured to turn on the second gate when the first gate is on.

Example 4. The monolithically integrated bidirectional switch of example 3, wherein the synchronous rectification circuit comprises a level shifter electrically connected to a driver for the second gate.

Example 5. The monolithically integrated bidirectional switch of example 3, wherein the synchronous rectification circuit comprises: a bootstrap capacitor having a first plate electrically connected to the input terminal and a second plate electrically connected to a driver for the second gate; and a bootstrap diode having an anode electrically connected to a voltage supply node and a cathode electrically connected to the second plate of the bootstrap capacitor.

Example 6. The monolithically integrated bidirectional switch of example 5, wherein the synchronous rectification circuit further comprises a resistor in parallel with the bootstrap capacitor.

Example 7. The monolithically integrated bidirectional switch of any of examples 1 through 6, wherein the first gate is a normally-on gate, wherein the second gate is a normally-on gate, and wherein the second gate is electrically connected to the input terminal via a discrete diode or a diode that is monolithically integrated with the bidirectional switch.

Example 8. The monolithically integrated bidirectional switch of example 7, wherein the discrete diode is integrated in a same package as the monolithically integrated bidirectional switch.

Example 9. The monolithically integrated bidirectional switch of example 7, wherein the compound semiconductor substrate is a GaN substrate, and wherein the discrete diode is a Si diode.

Example 10. The monolithically integrated bidirectional switch of example 7, wherein the first gate is a normally-on gate, wherein the second gate is a normally-on gate, and wherein the second gate is electrically connected to the input terminal via a transistor device electrically connected to the second gate in a cascode configuration.

Example 11. A monolithically integrated bidirectional switch, comprising: an input terminal; an output terminal; a control terminal; a compound semiconductor substrate; a common drift region in the compound semiconductor substrate and in series between the input terminal and the output terminal; a first gate; and a second gate, wherein one of the first gate and the second gate is a normally-on gate and the other one of the first gate and the second gate is a normally-off gate, such that the monolithically integrated bidirectional switch is configured to conduct current in a single direction from the input terminal to the output terminal through the common drift region.

Example 12. The monolithically integrated bidirectional switch of example 11, wherein the first gate is a normally-on gate, and wherein the second gate is a normally-off gate.

Example 13. The monolithically integrated bidirectional switch of example 12, further comprising a synchronous rectification circuit configured to turn on the second gate when current is flowing through the first gate.

Example 14. The monolithically integrated bidirectional switch of example 13, wherein the synchronous rectification circuit comprises an active synchronous rectification circuit with self-sensing control.

Example 15. The monolithically integrated bidirectional switch of example 13, wherein the synchronous rectification circuit comprises: a bootstrap capacitor having a first plate electrically connected to the input terminal and a second plate electrically connected to a driver for the second gate; and a bootstrap diode having an anode electrically connected to a voltage supply node and a cathode electrically connected to the second plate of the bootstrap capacitor.

Example 16. The monolithically integrated bidirectional switch of example 15, wherein the synchronous rectification circuit further comprises a resistor in parallel with the bootstrap capacitor.

Example 17. The monolithically integrated bidirectional switch of any of examples 11 through 16, wherein the first gate is a normally-off gate, wherein the second gate is a normally-on gate, and wherein the second gate is electrically connected to the input terminal via a discrete diode or a diode that is monolithically integrated with the bidirectional switch.

Example 18. The monolithically integrated bidirectional switch of example 17, wherein the discrete diode is integrated in a same package as the monolithically integrated bidirectional switch.

Example 19. The monolithically integrated bidirectional switch of example 17, wherein the compound semiconductor substrate is a GaN substrate, and wherein the discrete diode is a Si diode.

Example 20. The monolithically integrated bidirectional switch of example 17, wherein the first gate is a normally-off gate, wherein the second gate is a normally-on gate, and wherein the second gate is electrically connected to the input terminal via a transistor device electrically connected to the second gate in a cascode configuration.

Example 21. An electronic system, comprising: a power converter having an input side and an output side; and a rectification or inverter circuit between the input side and the output side of the power converter, the rectification or inverter circuit comprising one or more phases, wherein each phase of the rectification or inverter circuit comprises a first monolithically integrated bidirectional switch electrically connected in series with a second monolithically integrated bidirectional switch at a phase node, wherein each first monolithically integrated bidirectional switch and each second monolithically integrated bidirectional switch comprises: an output terminal; a control terminal; a compound semiconductor substrate; a common drift region in the compound semiconductor substrate and in series between the input terminal and the output terminal; a first gate; and a second gate, wherein the first gate is electrically connected to the control terminal and the second gate is electrically connected to the input terminal, or one of the first gate and the second gate is a normally-on gate and the other one of the first gate and the second gate is a normally-off gate, such that the monolithically integrated bidirectional switch is configured to conduct current in a single direction from the input terminal to the output terminal through the common drift region.

As used herein, the terms "having," "containing," "including," "comprising," and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A monolithically integrated bidirectional switch, comprising:
    a current input terminal;
    a current output terminal;
    a control terminal;
    a compound semiconductor substrate;
    a common drift region in the compound semiconductor substrate and in series between the current input terminal and the current output terminal;
    a first gate; and
    a second gate,
    wherein the first gate is electrically connected to the control terminal and the second gate is electrically connected to the current input terminal, such that the monolithically integrated bidirectional switch is configured to block voltages of both polarities and conduct current in a single direction from the current input terminal to the current output terminal through the common drift region via active control of the first gate.

2. The monolithically integrated bidirectional switch of claim 1, wherein the first gate is a normally-off gate, and wherein the second gate is a normally-off gate.

3. The monolithically integrated bidirectional switch of claim 2, further comprising a synchronous rectification circuit configured to turn on the second gate when the first gate is on.

4. The monolithically integrated bidirectional switch of claim 3, wherein the synchronous rectification circuit comprises a level shifter electrically connected to a driver for the second gate.

5. The monolithically integrated bidirectional switch of claim 3, wherein the synchronous rectification circuit comprises:
    a bootstrap capacitor having a first plate electrically connected to the current input terminal and a second plate electrically connected to a driver for the second gate; and
    a bootstrap diode having an anode electrically connected to a voltage supply node and a cathode electrically connected to the second plate of the bootstrap capacitor.

6. The monolithically integrated bidirectional switch of claim 5, wherein the synchronous rectification circuit further comprises a resistor in parallel with the bootstrap capacitor.

7. The monolithically integrated bidirectional switch of claim 1, wherein the first gate is a normally-on gate, wherein the second gate is a normally-on gate, and wherein the second gate is electrically connected to the current input terminal via a discrete diode or a diode that is monolithically integrated with the bidirectional switch.

8. The monolithically integrated bidirectional switch of claim 7, wherein the discrete diode is integrated in a same package as the monolithically integrated bidirectional switch.

9. The monolithically integrated bidirectional switch of claim 7, wherein the compound semiconductor substrate is a GaN substrate, and wherein the discrete diode is a Si diode.

10. The monolithically integrated bidirectional switch of claim 7, wherein the first gate is a normally-on gate, wherein the second gate is a normally-on gate, and wherein the second gate is electrically connected to the current input terminal via a transistor device electrically connected to the second gate in a cascode configuration.

11. An electronic system, comprising:
    a power converter having an input side and an output side; and
    a rectification or inverter circuit between the input side and the output side of the power converter, the rectification or inverter circuit comprising one or more phases,
    wherein each phase of the rectification or inverter circuit comprises a first monolithically integrated bidirectional switch electrically connected in series with a second monolithically integrated bidirectional switch at a phase node,
    wherein each first monolithically integrated bidirectional switch and each second monolithically integrated bidirectional switch comprises:
        an output terminal;
        a control terminal;
        a compound semiconductor substrate;
        a common drift region in the compound semiconductor substrate and in series between the input terminal and the output terminal;
        a first gate; and
        a second gate,
        wherein the first gate is electrically connected to the control terminal and the second gate is electrically connected to the input terminal, or one of the first gate and the second gate is a normally-on gate and the other one of the first gate and the second gate is a normally-off gate, such that the monolithically integrated bidirectional switch is configured to conduct current in a single direction from the input terminal to the output terminal through the common drift region.

* * * * *